United States Patent [19]

Yamanaka

[11] Patent Number: 4,771,217
[45] Date of Patent: Sep. 13, 1988

[54] VERTICAL DEFLECTION CIRCUIT FOR A CATHODE-RAY TUBE HAVING A VERTICAL IMAGE-POSITION ADJUSTMENT CIRCUIT

[75] Inventor: Hideo Yamanaka, Fukaya, Japan

[73] Assignee: Kabushiki Kaisha Toshiba, Kawasaki, Japan

[21] Appl. No.: 30,057

[22] Filed: Mar. 25, 1987

[30] Foreign Application Priority Data

Mar. 28, 1986 [JP] Japan .............................. 61-44817[U]

[51] Int. Cl.⁴ ............................................ H01J 29/54
[52] U.S. Cl. ...................................... 315/398; 315/396
[58] Field of Search ......................... 315/396, 397, 398

[56] References Cited

U.S. PATENT DOCUMENTS

| | | | |
|---|---|---|---|
| 3,020,443 | 2/1962 | Teetor ................................. | 315/398 |
| 3,881,134 | 4/1975 | Haferl ................................. | 315/398 |
| 3,994,882 | 3/1976 | Takahashi ........................... | 315/398 |
| 4,164,688 | 8/1979 | Cushing .............................. | 315/398 |
| 4,188,567 | 2/1980 | Monroe .............................. | 315/396 |
| 4,238,713 | 12/1980 | Moles ................................. | 315/397 |
| 4,314,184 | 2/1982 | Ryan .................................. | 315/397 |

FOREIGN PATENT DOCUMENTS 56-30043 7/1981 Japan .

Primary Examiner—Theodore M. Blum
Assistant Examiner—David Cain
Attorney, Agent, or Firm—Cushman, Darby & Cushman

[57] ABSTRACT

A deflection current from a vertical deflection output circuit is supplied to a series circuit of a vertical deflection coil and a capacitor. A pair of transistors are coupled to a DC voltage source in a complementary arrangement. The bases of these transistors are coupled to a slidable end of a variable resistor coupled to the DC voltage source, respectively through constant voltage elements, which are coupled to each other in the opposite directions. The node of these two transistors is coupled to the node of the deflection coil and the capacitor. As the position of the slidable end of the variable resistor is moved away from the center, one transistor of the pair becomes conductive. With this arrangement, a deflection current free of ripple components can be supplied to the deflection coil in order to adjust the vertical position of an image on the screen of a CRT.

23 Claims, 3 Drawing Sheets

FIG. 1
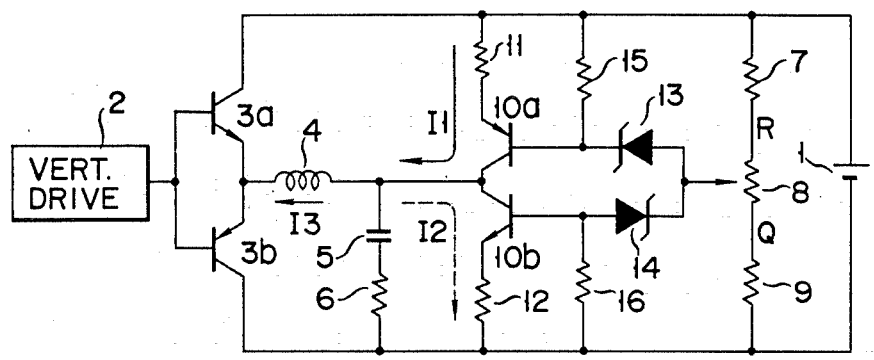
FIG. 2
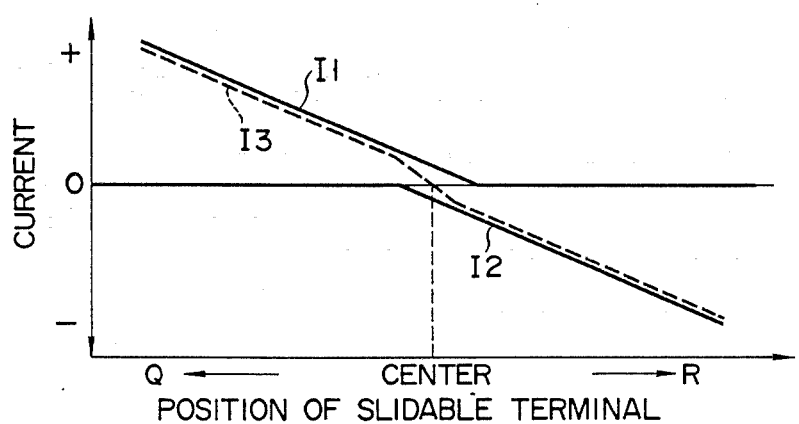
FIG. 3

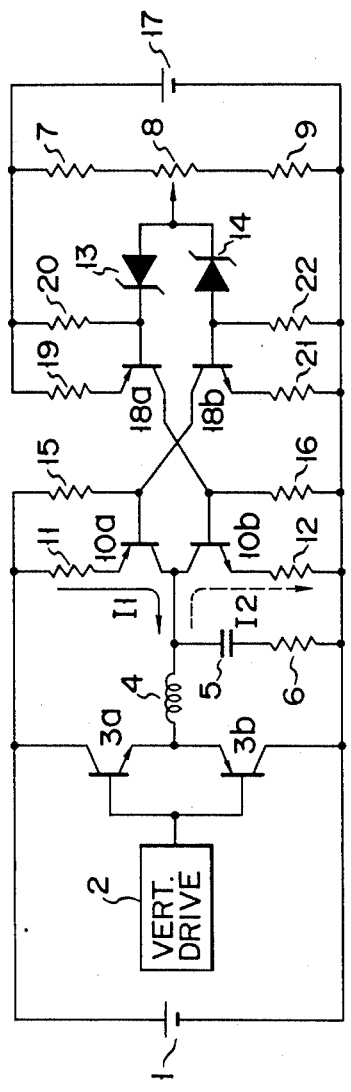
F I G. 4
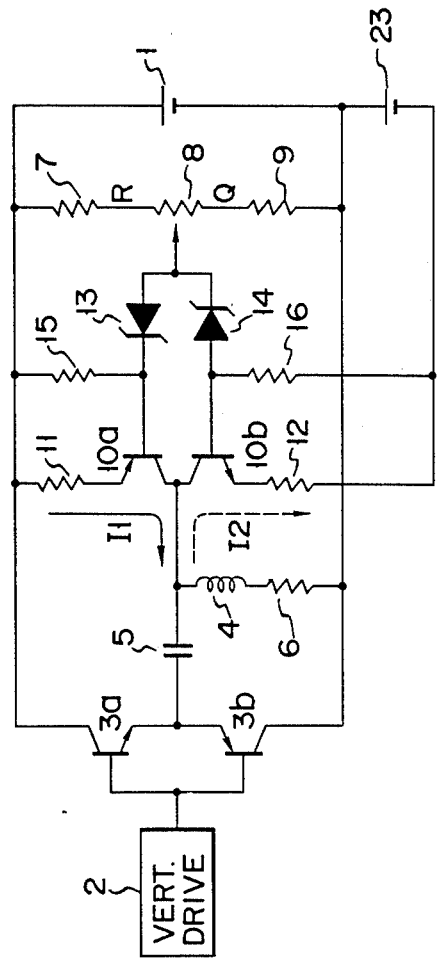
F I G. 5

4,771,217

VERTICAL DEFLECTION CIRCUIT FOR A CATHODE-RAY TUBE HAVING A VERTICAL IMAGE-POSITION ADJUSTMENT CIRCUIT

BACKGROUND OF THE INVENTION

This invention relates to a vertical deflection circuit and, more particularly, to a vertical deflection circuit having a vertical image-position adjustment circuit for vertically adjusting an image position on the screen of a cathode-ray tube (CRT).

An image display device with a CRT, such as a television receiver, is commonly provided with a circuit for vertical adjustment of the position of an image in order to compensate for an image-position deflection originating from deflection of a beam spot of the CRT, or for the purpose of properly correcting the image position as desired.

This image-position adjustment circuit typically has two vertical-output transistors coupled, for example, between both terminals of a DC voltage source in a push-pull manner. These transistors are driven by the output of a vertical drive circuit, and the node of transistors is coupled to a series circuit of a deflection coil, a capacitor and a resistor. A series circuit of a resistor, a variable resistor and another resistor is also coupled between both terminals of the DC voltage source. The node of the deflection coil and the capacitor is coupled to a slidable end of the variable resistor.

With the above arrangement, the output of the vertical-output transistors causes a deflection current to flow across the deflection coil of the image-position adjustment circuit. Further, the direction of the DC deflection current flowing through the deflection coil can be varied by changing the resistance of the variable resistor so that the position of an image on the CRT's screen is vertically adjusted.

In this image-position adjustment circuit, however a parabolic voltage is generated at the node of the deflection coil and the capacitor. This parabolic voltage varies the DC potential at the slidable end of the variable resistor and thus causes a parabolic ripple current to flow through the deflection coil, deforming a displayed image. The circuit disclosed in the Japanese Utility Model Publication No. 56-30043 is designed for a solution to this problem. However, the disclosed circuit cannot completely remove the aforementioned ripple component from the deflection current.

SUMMARY OF THE INVENTION

With the above situation in mind, this invention has been devised, and its object is to provide a vertical deflection circuit for a CRT having a vertical image-position adjustment circuit capable of completely eliminating a ripple current caused by a parabolic voltage so as to provide a deflection current with a high linearity.

To achieve this object, the vertical deflection circuit for a CRT having the image-position adjustment circuit of this invention comprises:

DC voltage source means having first and second terminals;

a series circuit of a vertical deflection coil and a capacitor;

a vertical output means for supplying a deflection current to the vertical deflection coil;

first and second transistors coupled together in a complementary arrangement, the transistors being connected between the first and second terminals of the DC voltage source means, a node of the first and second transistors being coupled to a node of the vertical deflection coil and the capacitor;

variable voltage generating means for generating a variable DC voltage; and first and second constant voltage elements, respectively coupled in opposite directions between the variable voltage generating means and bases of the first and second transistors, whereby either the first or second transistor is activated in response to the variable DC voltage.

BRIEF DESCRIPTION OF THE DRAWINGS

FIG. 1 is a circuit diagram of a vertical deflection circuit for a CRT having a vertical image-position adjustment circuit according to this invention;

FIGS. 2 and 3 are graphs showing the operational characteristics of the circuit of FIG. 1; and FIGS. 4 to 7 are circuit diagrams each showing a vertical deflection circuit according to a different embodiment of this invention.

DETAILED DESCRIPTION OF THE PREFERRED EMBODIMENTS

Figure 6:
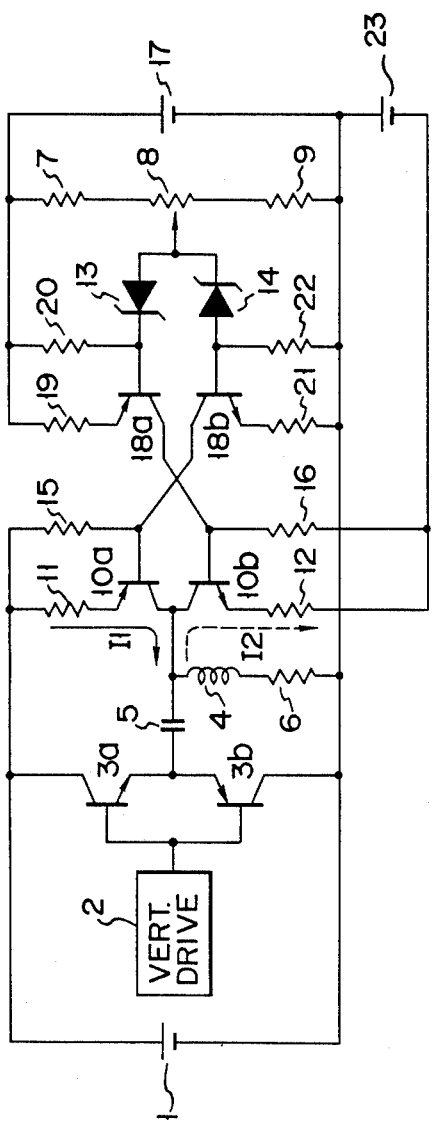
Figure 7:
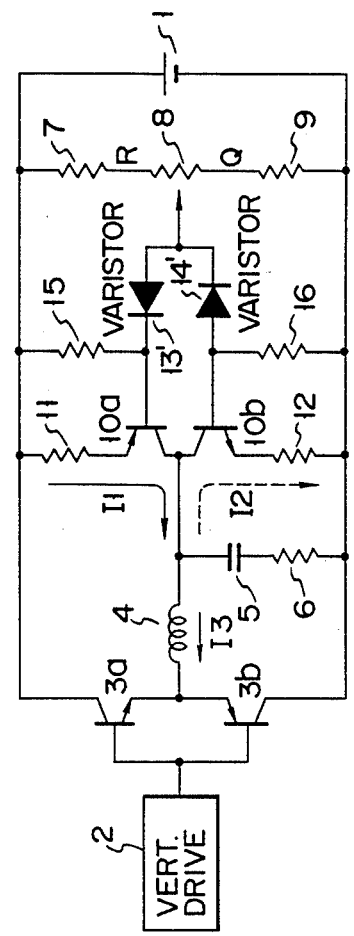

An embodiment of this invention will now be explained with reference to the accompanying drawings.

FIG. 1 is a circuit diagram of the first embodiment. Vertical-output transistors $3a$ and $3b$ are coupled between both terminals of a DC voltage source 1 in a push-pull arrangement, and they are driven by the output of a vertical drive circuit 2. The node of transistors $3a$ and $3b$ is coupled to a series circuit of a deflection coil 4, a capacitor 5 and a resistor 6 such that a vertical deflection current flows across deflection coil 4.

A series circuit of a resistor 7, a variable resistor 8 and another resistor 9 is coupled between the terminals of DC voltage source 1. This series circuit is coupled in parallel to a series circuit of a resistor 11, the emitter-collector path of a PNP transistor $10a$, the collector-emitter path of an NPN transistor $10b$ and a resistor 12. Transistor $10a$ has its base coupled to the cathode of a Zener diode 13 whose anode is coupled to a slidable end of variable resistor 8. Transistor $10b$ has its base coupled to the anode of a Zener diode 14 whose cathode is also coupled to the slidable end of variable resistor 8. A resistor 15 is coupled between one terminal of DC voltage source 1 and the base of transistor $10a$, and a resistor 16 is coupled between the other terminal of DC voltage source 1 and the base of transistor $10b$.

Transistors $10a$ and $10b$ are coupled together in a complementary arrangement and constitute a constant current circuit together with Zener diodes 13 and 14 which are respectively coupled to the bases of the transistors. A current flowing through transistors $10a$ and $10b$ is dependent on the position of the slidable end of variable resistor 8.

The operation of the circuit shown in FIG. 1 will now be explained in conjunction with FIG. 2.

Suppose that in FIG. 1 the slidable end of variable resistor 8 is moved toward point Q. Then, the voltage across resistor 15 increases so that a collector current $I_1$ of transistor $10a$ increases as shown in FIG. 2. The voltage across resistor 16, however, decreases, thus increasing a collector current $I_2$ of transistor $10b$ toward zero in the positive-potential direction (see FIG. 2). On the other hand, when the slidable end of variable resistor 8 slides toward point R in FIG. 1, the collector current $I_1$ of transistor 10a decreases and the collector current $I_2$ of transistor 10b increases in the negative-potential direction. Therefore, the current difference $I_3$ between $I_1$ and $I_2$ has the characteristic as indicated by the dotted line shown in FIG. 2.

As should be clear from FIG. 2, varying the resistance of variable resistor 8 changes the current difference $I_3$ between collector currents $I_1$ and $I_2$. To be specific, when the position of the slidable end of variable resistor 8 is moved toward point Q, Zener diode 13 becomes conductive and Zener diode 14 becomes nonconductive. As a result, collector current $I_1$ corresponding to the slid position flows through transistor 10a. Similarly when the slidable end of variable resistor 8 slides toward point R, Zener diode 14 becomes conductive and Zener diode 13 becomes nonconductive, thus causing collector current $I_2$ corresponding to the slid position to flow through transistor 10b. The difference current $I_3$ between $I_1$ and $I_2$ flows across deflection coil 4, thus adjusting the position of an image on the screen of a CRT, and when the slidable end of variable resistor 8 is positioned at the center, both the Zener diodes 13 and 14 are conductive so that currents flow through both of transistors 10a and 10b. Consequently, the position of an image on the CRT's screen can be smoothly changed.

By properly selecting the characteristics of Zener diodes 13 and 14 and/or variable resistor 8, it is possible to make both the transistors 10a and 10b nonconductive when the slidable end of variable resistor 8 is at the center as shown in FIG. 3. In this case, it is also possible to make the image position stay unchanged when the slidable end of variable resistor 8 is within a predetermined range around the center point. This would reduce a power dissipation of the image-position adjustment circuit. Also, according to the image-position adjustment circuit of this embodiment, currents $I_1$ and $I_2$ can respectively flow through transistors 10a and 10b without adverse influence of a parabolic voltage component on the collectors thereof by causing these transistors 10a and 10b to act as a constant current circuit.

The second embodiment of this invention will now be explained in conjunction with FIG. 4.

The circuit of FIG. 4 differs from the circuit of FIG. 1 in the following points:

(1) Another DC voltage source 17, which generates a voltage lower than that of voltage source 1, is provided.

(2) The series circuit of resistor 7, variable resistor 8 and resistor 9 is coupled between both terminals of DC voltage source 17.

(3) The slidable end of variable resistor 8 is coupled to the anode of Zener diode 13 and the cathode of Zener diode 14, and the cathode of the former diode and the anode of the latter diode are respectively coupled to the bases of transistors 18a and 18b.

(4) The collector of transistor 18a is coupled to the base of transistor 10b, while the collector of transistor 18b is coupled to the base of transistor 10a.

(5) Resistors 19 and 20 are coupled between the DC voltage source 17 and the emitter and base of transistor 18a, respectively, and resistors 21 and 22 are coupled between DC voltage source 17 and the emitter and base of transistor 18b, respectively.

The Zener diodes 13 and 14 of the circuit of FIG. 4 can be of a rated voltage lower than that of the Zener diodes 13 and 14 of the circuit of FIG. 1. Therefore, the temperature coefficients of these diodes in the circuit of FIG. 4 can be reduced, thus reducing the temperature drifts. For example, when Zener diodes 13 and 14 have a rated voltage of about five volts, the temperature drifts can be cancelled out by the temperature coefficients of the base-emitter voltages ($V_{BE}$) of transistors 18a and 18b. Also, when Zener diodes with a rated voltage of seven volts are used for diodes 13 and 14, the temperature drifts can be cancelled out by connecting an additional diode in series to each of diodes 13 and 14.

FIG. 5 shows another embodiment of this invention, in which the locations of deflection coil 4 and capacitor 5 of the first and second embodiments are reversed. In addition, another DC voltage source 23 is connected in series to DC voltage source 1, and the emitter and base of transistor 10b are coupled to the minus terminal of DC voltage source 23 respectively through resistors 12 and 16.

In the circuit of FIG. 5, the collector current $I_1$ of transistor 10a flows from the plus terminal of DC voltage source 1 to the minus terminal thereof through resistor 11, the emitter-collector path of transistor 10a, deflection coil 4 and resistor 6. The collector current $I_2$ of transistor 10b, on the other hand, flows from the plus terminal of DC voltage source 23 to the minus terminal thereof through resistor 6, deflection coil 4, the collector-emitter path of transistor 10b and resistor 12.

FIG. 6 shows a modification of the circuit of FIG. 5, which is designed, like the circuit of FIG. 4, so as to reduce the temperature coefficients of Zener diodes 13 and 14. The circuit of FIG. 6 differs from the circuit of FIG. 5 in the following points:

(1) In addition to DC voltage source 1, a DC voltage source 17 whose voltage is lower than voltage source 1 is provided.

(2) The series circuit of resistor 7, variable resistor 8 and resistor 9 is coupled between both terminals of DC voltage source 17.

(3) The slidable end of variable resistor 8 is coupled to the anode of Zener diode 13 and the cathode of Zener diode 14, and the cathode of the former diode and the anode of the latter diode are respectively coupled to the bases of transistors 18a and 18b.

(4) The collector of transistor 18a is coupled to the base of transistor 10b, while the collector of transistor 18b is coupled to the base of transistor 10a.

(5) Resistors 19 and 20 are coupled between the DC voltage source 17 and the emitter and base of transistor 18a, respectively, and resistors 21 and 22 are coupled between DC voltage source 17 and the emitter and base of transistor 18b, respectively.

The Zener diodes 13 and 14 of the circuit of FIG. 6 can be of a rated voltage lower than that of the Zener diodes 13 and 14 of the circuit of FIG. 5. Therefore, the temperature coefficients of these diodes in the circuit of FIG. 6 can be reduced, thus reducing the temperature drifts.

As explained above, since the vertical deflection circuit for a CRT having the vertical image-position adjustment circuit of this invention uses a constant current circuit to make a DC deflection current flow through a deflection coil to adjust the position of an image on the screen of a CRT, the DC current is free of ripple components which would otherwise deform the image. Accordingly, the deflection current has a high linearity and the amount of adjustment can be set as desired.

This invention is not limited to the aforementioned embodiments. For example, Zener diodes 13 and 14 may be replaced with other constant voltage elements, such as varistors 13' and 14' used in the circuit of FIG.

7. The circuit of this invention may be otherwise modified in various manners without departing from the scope of the invention.

What is claimed is:

1. A vertical deflection circuit for a cathode-ray tube (CRT), having a circuit for vertically adjusting the position of an image on the screen of the CRT, said vertical deflection circuit comprising:
   DC voltage source means having first and second terminals;
   a series circuit of a vertical deflection coil and a capacitor;
   a vertical output means for supplying a deflection current to said vertical deflection coil;
   first and second transistors coupled together in a complementary arrangement, said transistors being connected between said first and second terminals of said DC voltage source means, a node of said first and second transistors being coupled to a node of said vertical deflection coil and said capacitor;
   variable voltage generating means for generating a variable DC voltage; and
   first and second constant voltage elements, respectively coupled in opposite directions between said variable voltage generating means and bases of said first and second transistors, whereby either said first or second transistor is activated in response to said variable DC voltage.

2. The vertical deflection circuit according to claim 1, wherein said vertical deflection coil is coupled to said vertical output means, and said capacitor is connected to said second terminal of said DC voltage source.

3. The vertical deflection circuit according to claim 2, wherein said first transistor is a PNP transistor, which has a base coupled to said variable voltage generating means via said first constant voltage element, has a collector coupled to said node of said deflection coil and said capacitor, and has an emitter coupled to said first terminal of said DC voltage source means; and said second transistor is an NPN transistor, which has a base coupled to said variable voltage generating means via said second constant voltage element, has a collector coupled to said node of said deflection coil and said capacitor, and has an emitter coupled to said second terminal of said DC voltage source means.

4. The vertical deflection circuit according to claim 3, wherein said first constant voltage element has an anode coupled to said variable voltage generating means and a cathode coupled to said base of said first transistor; and said second constant voltage element has an anode coupled to said base of said second transistor and a cathode coupled to said variable voltage generating means.

5. The vertical deflection circuit according to claim 4, wherein said variable voltage generating means is coupled between said first and second terminals of said DC voltage source means.

6. The vertical deflection circuit according to claim 5, wherein said first and second constant voltage elements are Zener diodes.

7. The vertical deflection circuit according to claim 5, wherein said first and second constant voltage elements are varistors.

8. The vertical deflection circuit according to claim 3, further comprising second DC voltage source means having first and second terminals between which said variable voltage generating means is coupled.

9. The vertical deflection circuit according to claim 8, further comprising:
   a third transistor of an NPN type coupled between said first transistor and said second constant voltage element in such a manner that said third transistor has a base coupled to said second constant voltage element, a collector coupled to said base of said first transistor and an emitter coupled to said second terminal of said second DC voltage source means; and
   a fourth transistor of a PNP type coupled between said second transistor and said first constant voltage element in such a manner that said fourth transistor has a base coupled to said first constant voltage element, a collector coupled to said base of said second transistor and an emitter coupled to said first terminal of said second DC voltage source means.

10. The vertical deflection circuit according to claim 9, wherein said second constant voltage element has an anode coupled to said base of said third transistor and a cathode coupled to said variable voltage generating means; and said first constant voltage element has an anode coupled to said variable voltage generating means and a cathode coupled to said base of said fourth transistor.

11. The vertical deflection circuit according to claim 10, wherein said first and second constant voltage elements are Zener diodes.

12. The vertical deflection circuit according to claim 10, wherein said first and second constant voltage elements are varistors.

13. The vertical deflection circuit according to claim 1, wherein said vertical deflection coil is coupled to said second terminal of said DC voltage source, and said capacitor is connected to said vertical output means.

14. The vertical deflection circuit according to claim 13, wherein said DC voltage source means comprises first and third DC voltage source means each having first and second terminals, said second terminal of said first DC voltage source means being coupled to said first terminal of said third DC voltage source means; said variable voltage generating means is coupled between said first and second terminals of said first DC voltage source means; and said first and second transistors are coupled between said first terminal of said first DC voltage source means and said second terminal of said third DC voltage source means.

15. The vertical deflection circuit according to claim 14, wherein said first transistor is a PNP transistor, which has a base coupled to said variable voltage generating means via said first constant voltage element, a collector coupled to a node of said deflection coil and said capacitor, and an emitter coupled to said first terminal of said first DC voltage source means; and said second transistor is an NPN transistor, which has a base coupled to said variable voltage generating means via said second constant voltage element, a collector coupled to said node of said deflection coil and said capacitor, and an emitter coupled to said second terminal of said third DC voltage source means.

16. The vertical deflection circuit according to claim 15, wherein said first constant voltage element has an anode coupled to said variable voltage generating means and a cathode coupled to said base of said first transistor; and said second constant voltage element has an anode coupled to said base of said second transistor and a cathode coupled to said variable voltage generating means.

17. The vertical deflection circuit according to claim 16, wherein said first and second constant voltage elements are Zener diodes.

18. The vertical deflection circuit according to claim 16, wherein said first and second constant voltage elements are varistors.

19. The vertical deflection circuit according to claim 13, wherein said circuit further comprises second DC voltage source means having first and second terminals between which said variable voltage generating means is coupled; said DC voltage source means comprises first and third DC voltage source means each having first and second terminals, said second terminal of said first DC voltage source means being coupled to said first terminal of said third DC voltage source means; and said first and second transistors are coupled between said first terminal of said first DC voltage source means and said second terminal of said third DC voltage source means.

20. The vertical deflection circuit according to claim 19, further comprising:
 a third transistor of an NPN type coupled between said first transistor and said second constant voltage element in such a manner that said third transistor has a base coupled to said second constant voltage element, a collector coupled to said base of said first transistor and an emitter coupled to said second terminal of said second DC voltage source means; and
 a fourth transistor of a PNP type coupled between said second transistor and said first constant voltage element in such a manner that said fourth transistor has a base coupled to said first constant voltage element, a collector coupled to said base of said second transistor and an emitter coupled to said first terminal of said second DC voltage source means.

21. The vertical deflection circuit according to claim 20, wherein said second constant voltage element has an anode coupled to said base of said third transistor and a cathode coupled to said variable voltage generating means; and said first constant voltage element has an anode coupled to said variable voltage generating means and a cathode coupled to said base of said fourth transistor.

22. The vertical deflection circuit according to claim 21, wherein said first and second constant voltage elements are Zener diodes.

23. The vertical deflection circuit according to claim 21, wherein said first and second constant voltage elements are varistors.

* * * * *